United States Patent [19]

Lopez

[11] Patent Number: 4,621,552
[45] Date of Patent: Nov. 11, 1986

[54] METHOD AND APPARATUS FOR SEPARATING PRINTED-CIRCUIT BOARDS FROM MULTI-BOARD PANELS

[75] Inventor: Gilbert T. Lopez, Longmont, Colo.

[73] Assignee: Cencorp, Boulder, Colo.

[21] Appl. No.: 689,078

[22] Filed: Jan. 4, 1985

[51] Int. Cl.⁴ .............................................. B26D 5/26
[52] U.S. Cl. .......................................... 83/27; 83/33; 83/35; 83/62; 83/71; 83/104; 83/206; 83/277; 83/250; 83/360; 83/522
[58] Field of Search .................... 83/33, 206, 207, 277, 83/278, 415, 423, 522, 104, 71, 360, 62, 250, 35, 27; 269/50–52, 47; 198/692, 693; 271/84, 85, 141

[56] References Cited

U.S. PATENT DOCUMENTS

| | | | |
|---|---|---|---|
| 1,787,458 | 1/1931 | Swenson | 83/423 X |
| 1,992,962 | 3/1935 | Murch | 83/33 X |
| 3,835,743 | 9/1974 | Taylor et al. | 83/412 X |
| 3,854,889 | 12/1974 | Lemelson | 29/563 X |
| 4,040,318 | 8/1977 | Makeev et al. | 83/277 X |
| 4,519,284 | 5/1985 | Hunter et al. | 83/409 X |

Primary Examiner—James M. Meister
Attorney, Agent, or Firm—Fidelman, Wolffe & Waldron

[57] ABSTRACT

The instant invention is particularly directed to a method and apparatus for automated handling of panels comprising a plurality of interconnected substrates in order to control and separate the circuit boards in a continuous processing line. One embodiment incorporates two shearing stations and a rotary transfer device therebetween in order to transfer a panel portion from the first station to the second station while controlling and rotating the panel for subsequent feed to the second station such that the panel portion is cut on a line of the substrate which is perpendicular to the original line of cut of the substrate. Throughout the handling of the panels and panel portions, sensing, gripping, and indexed feeding of the panels and panel portions are under the control of a programmable computer.

20 Claims, 28 Drawing Figures

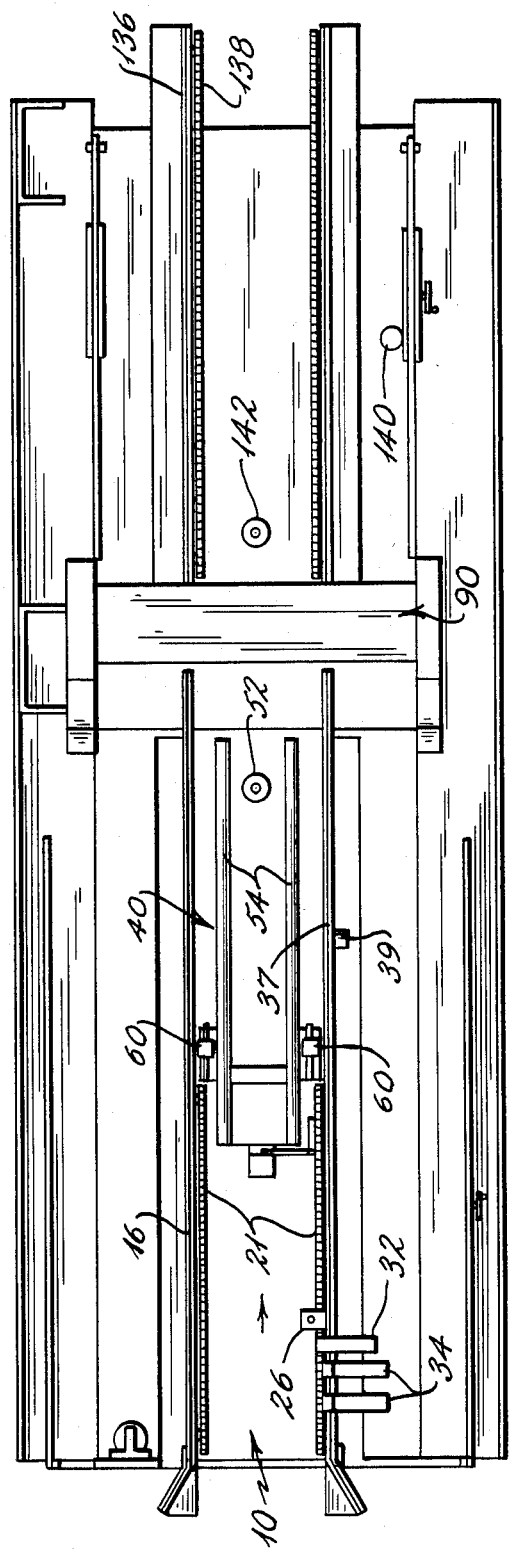

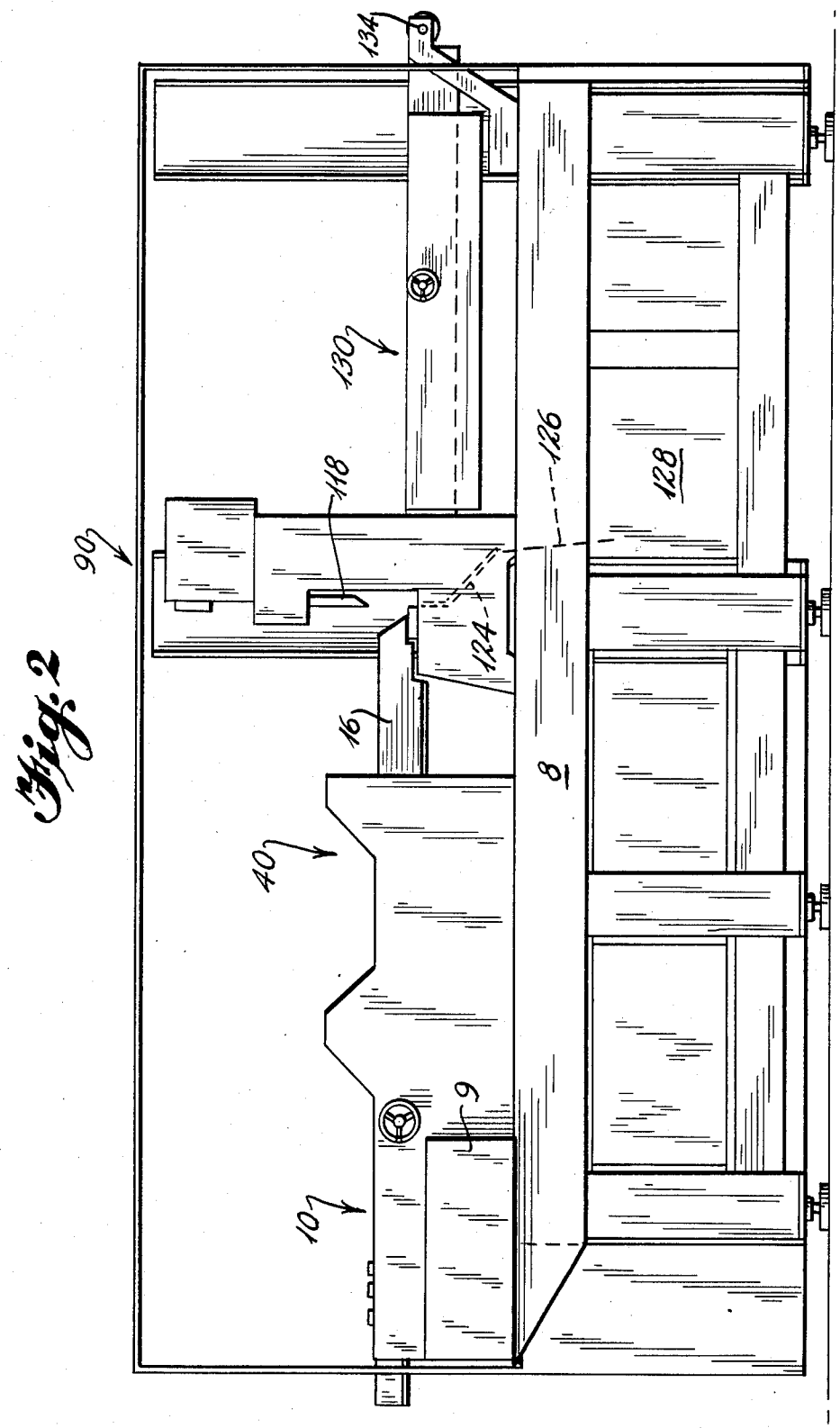

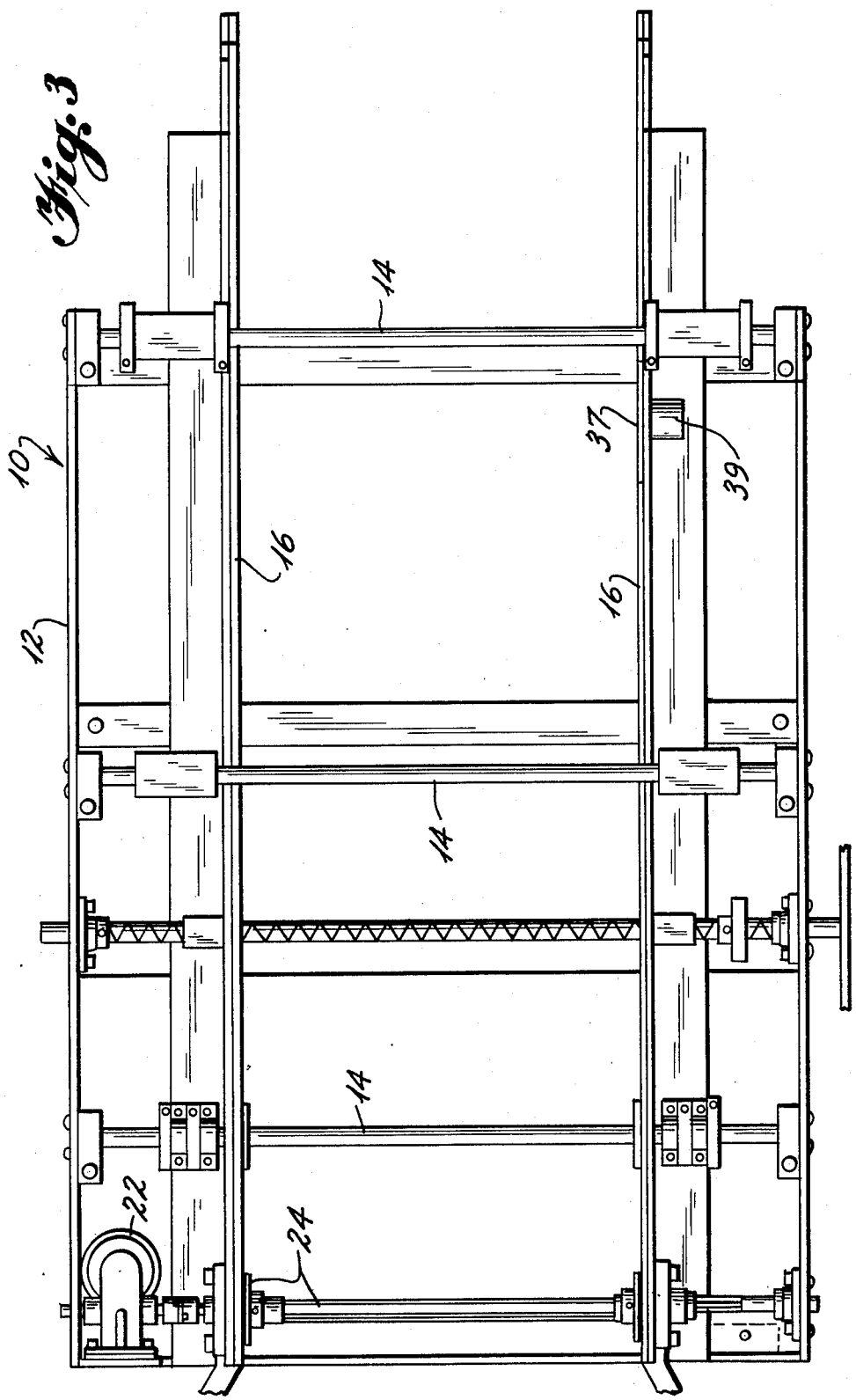

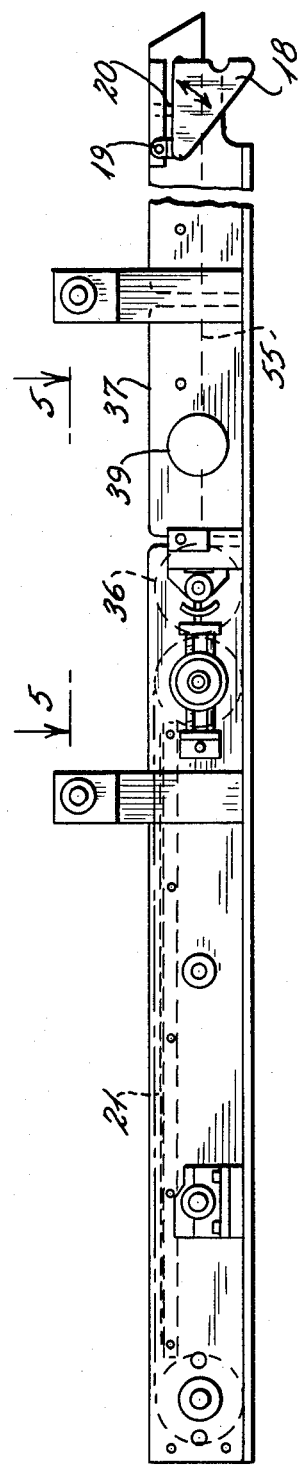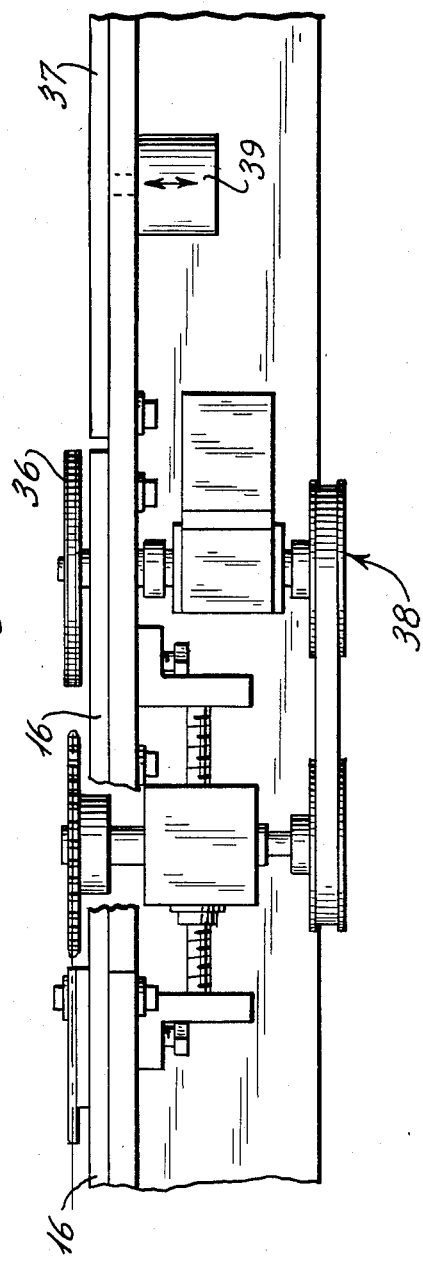

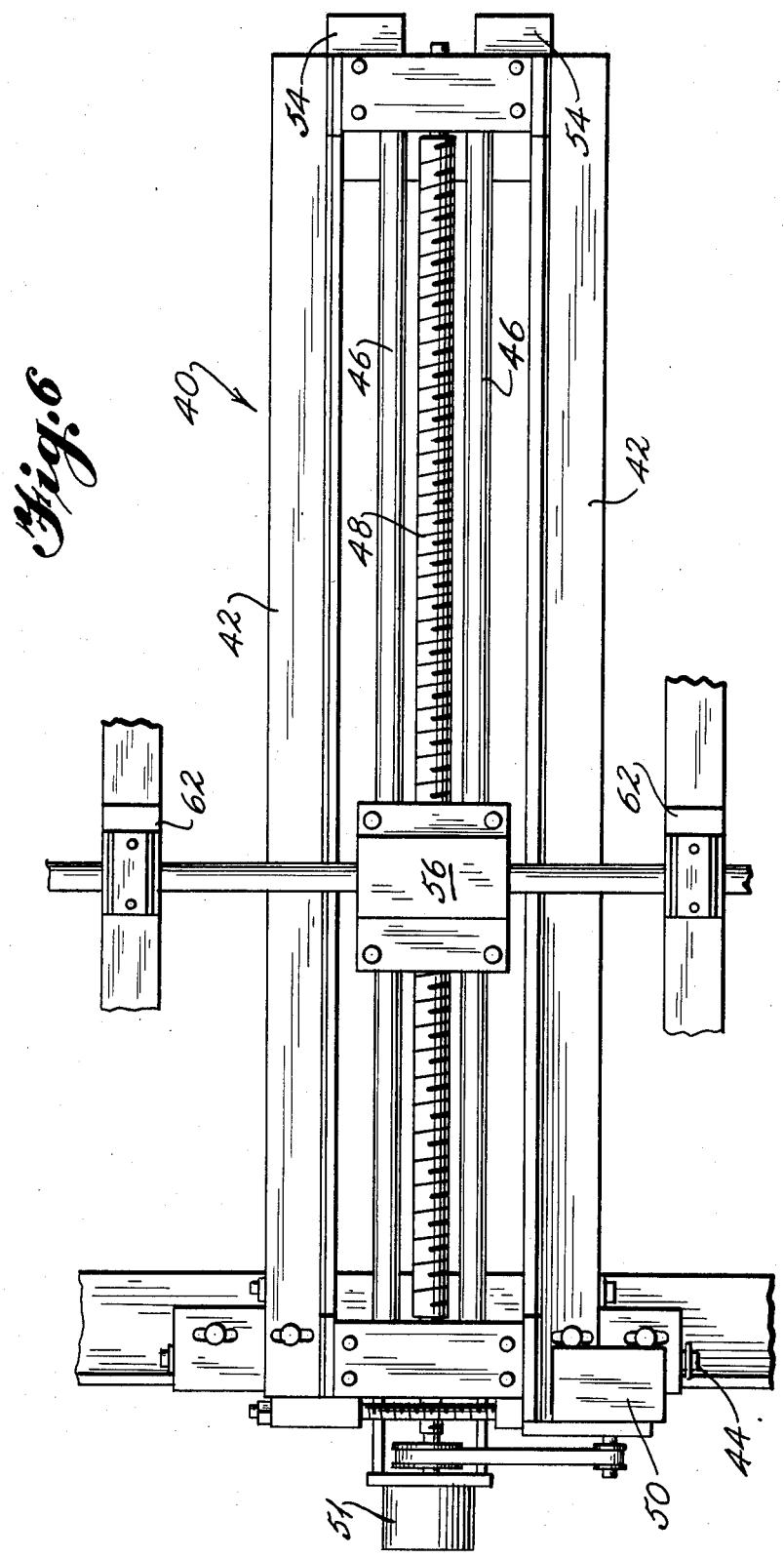

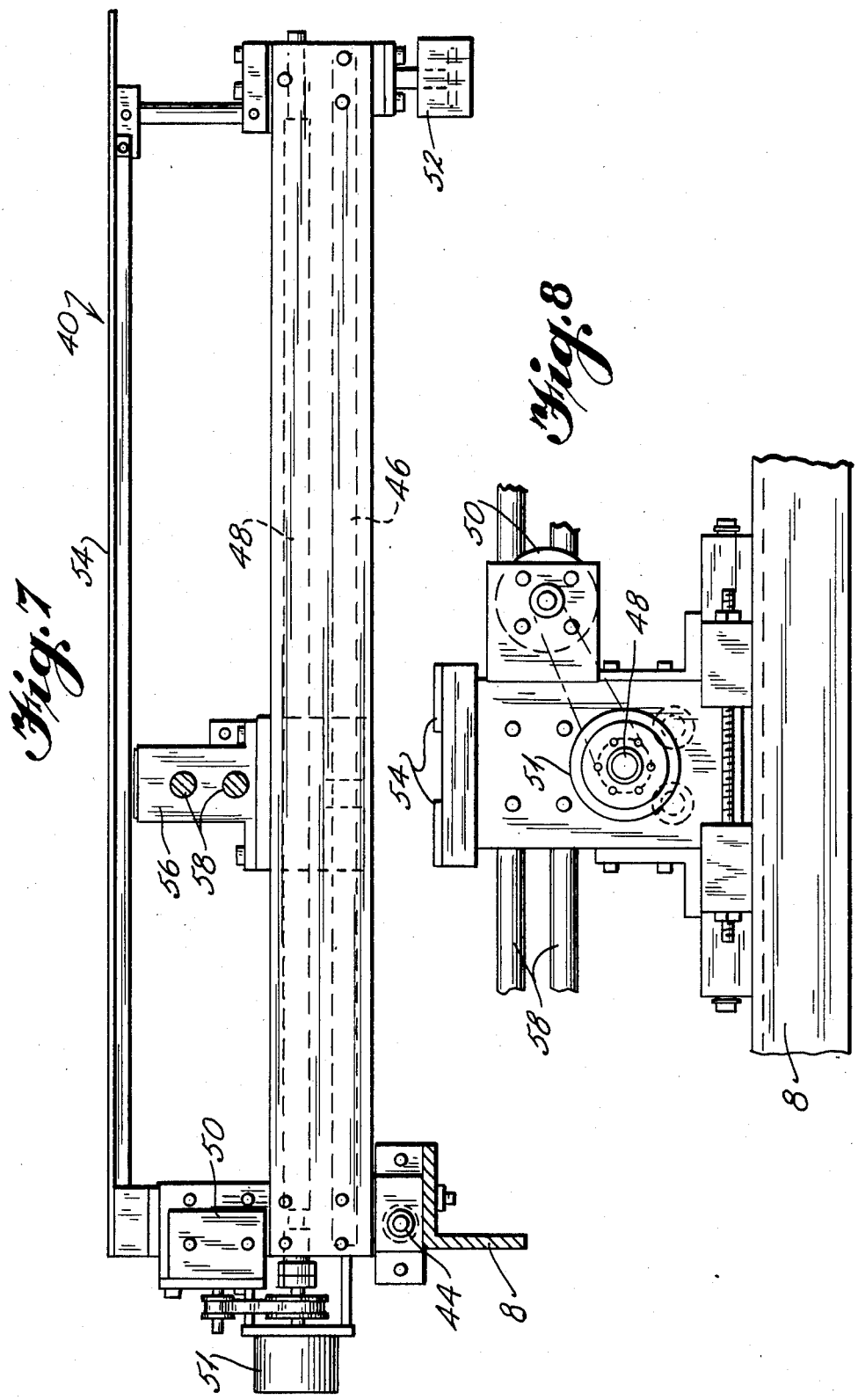

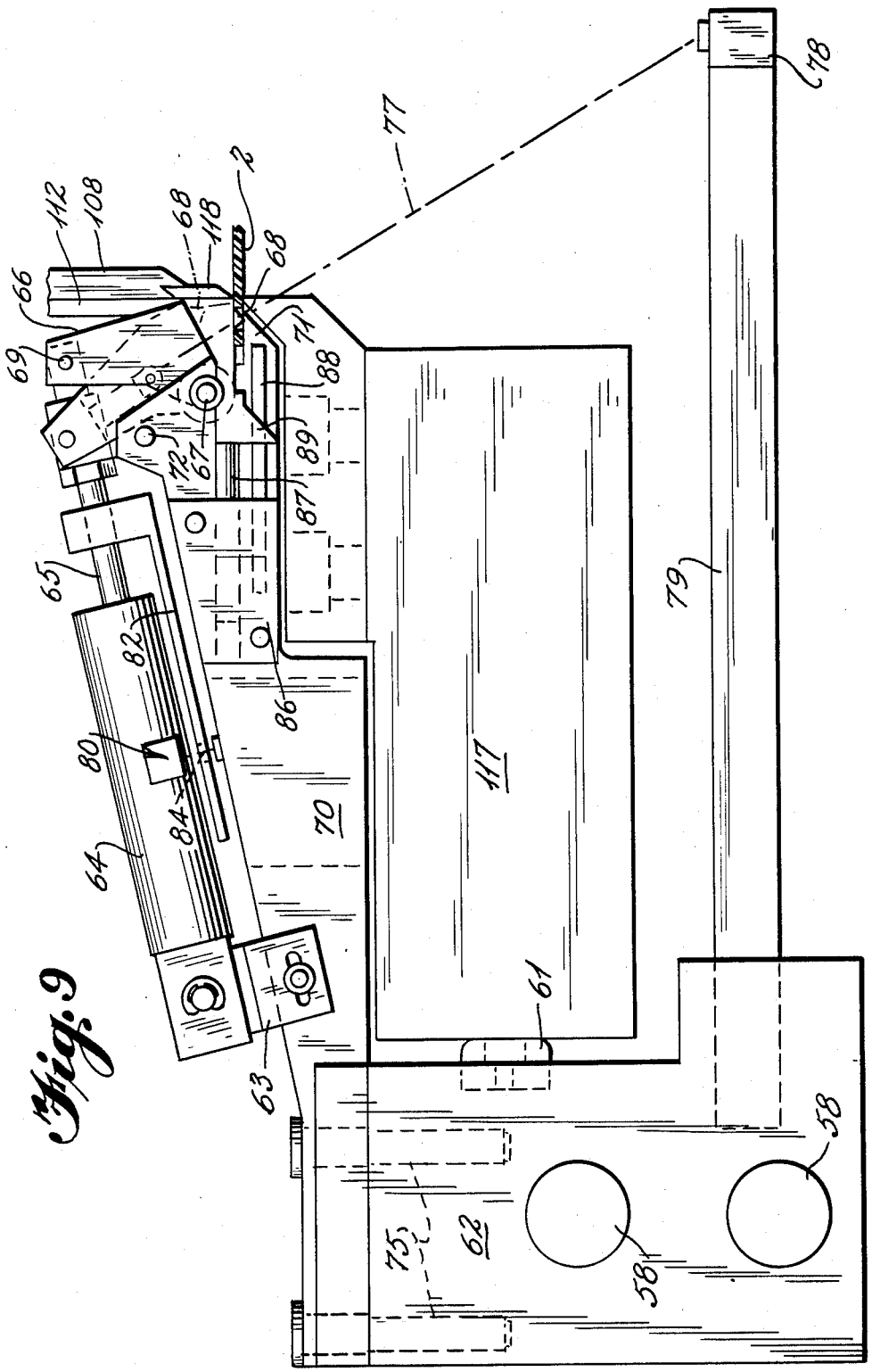

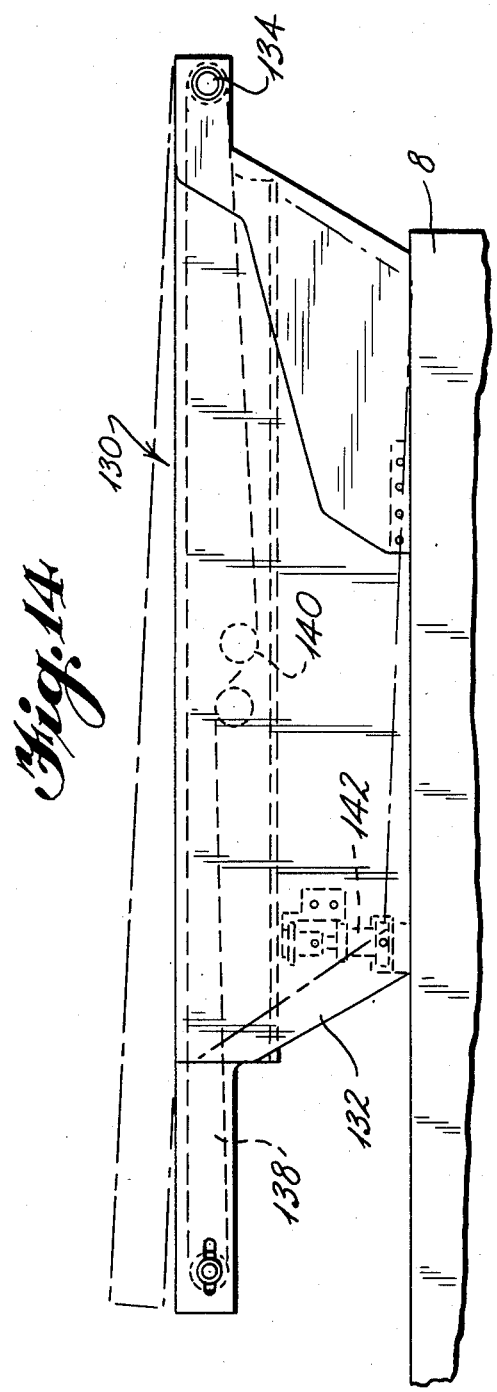

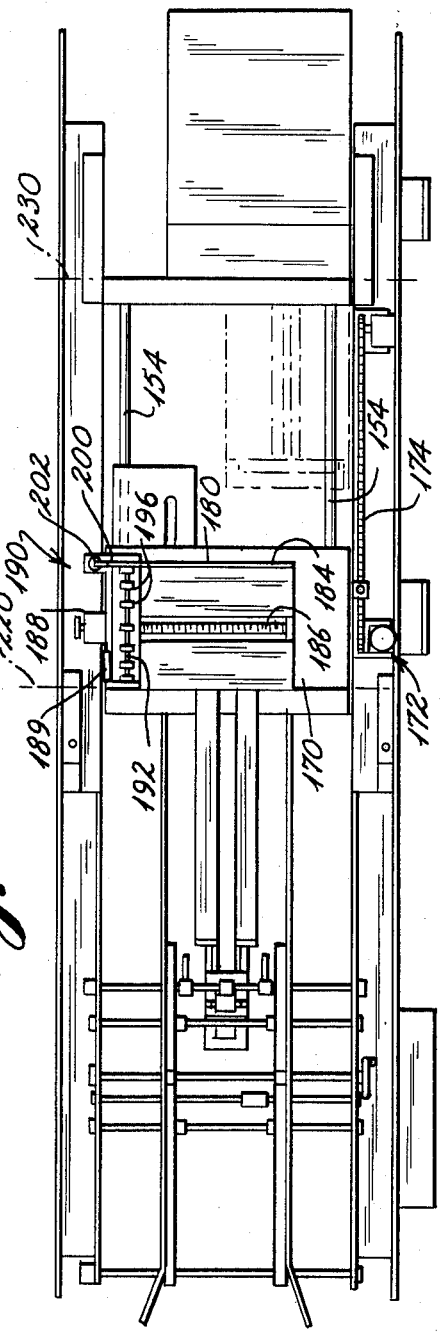
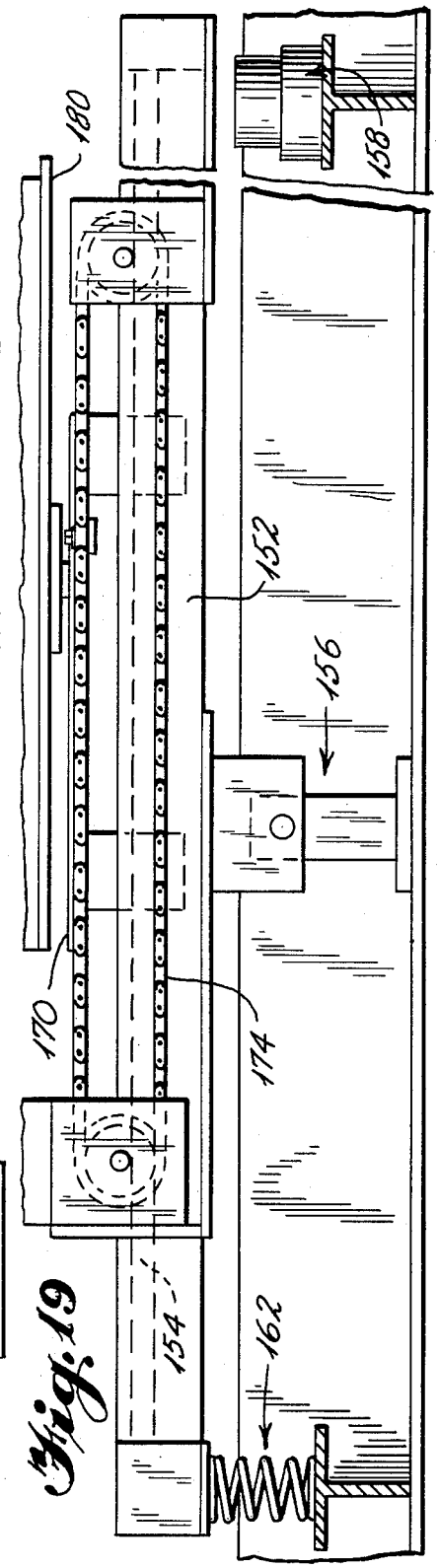
Fig. 17
Fig. 19

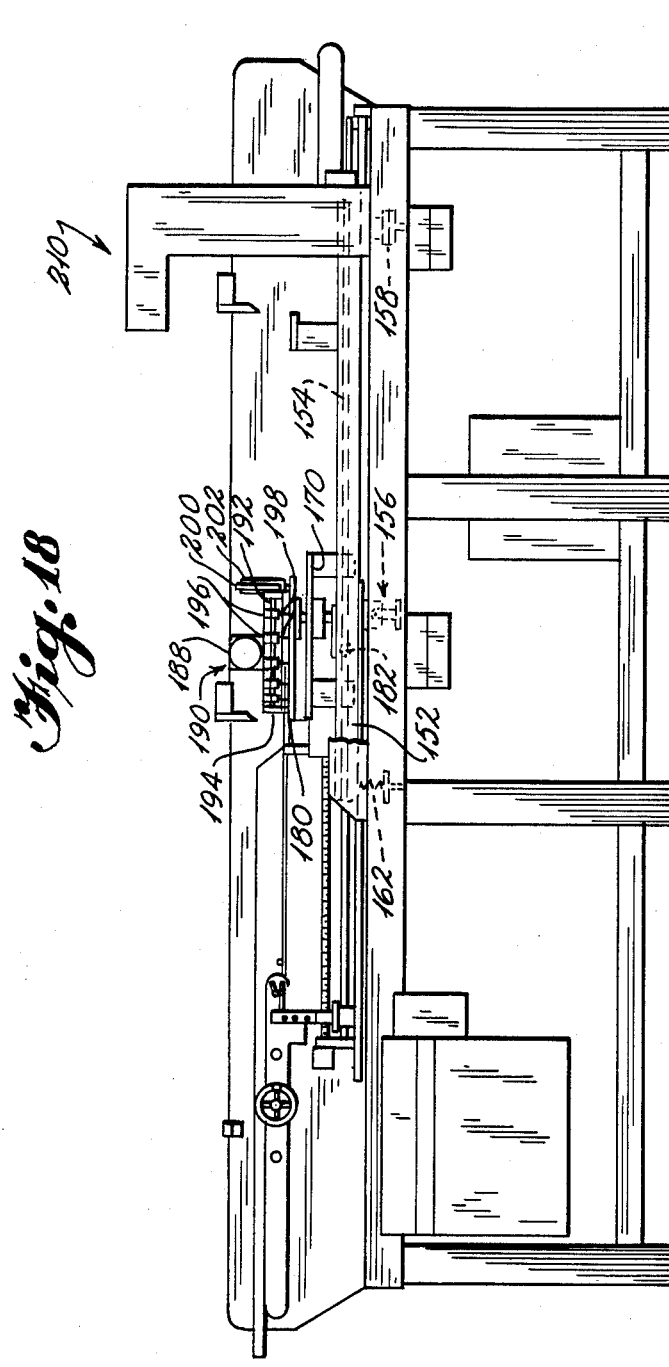

METHOD AND APPARATUS FOR SEPARATING PRINTED-CIRCUIT BOARDS FROM MULTI-BOARD PANELS

CROSS-REFERENCES TO PRIOR ART

U.S. Pat. No. 3,780,431—Feeney—PROCESS FOR PRODUCING COMPUTER CIRCUITS UTILIZING PRINTED CIRCUIT BOARDS.

U.S. Pat. No. 4,316,320—Nogawa, et al.—METHOD OF MANUFACTURING ELECTRONIC CIRCUIT APPARATUS.

U.S. Pat. No. 4,343,083—Takamura, et al.—METHOD OF MANUFACTURING FLEXIBLE PRINTED CIRCUIT SHEETS.

U.S. Pat. No. 4,426,773—Hargis—ARRAY OF ELECTRONIC PACKAGING SUBSTRATES.

BACKGROUND OF THE INVENTION

Substantial savings of time and money have been realized in the industry by handing a plurality of printed circuit boards (PCB's) while they are still interconnected in a panel of substrate material. Better utilization is realized with this approach in such processing as population of the PCB's with components, wave soldering of the populated boards, and quality control such as electrical function testing of whole boards or selected components, particularly when considering the automated processing demands of today's industry.

Methods for enabling separating of each prepopulated panel into plural, individual PCB's include: routing with tabs; scoring; perforation; and punch-back.

Routing with tabs comprises routing slots in the panel (while leaving spaced support tabs) to define the perimeters of the individual boards, so that the tabs may be cut or broken in order to perform board separation.

Scoring comprises grooving board perimeters on at least one side of the panel in order to effect board separation by breaking along the score-lines.

Perforation comprises drilling a series of closely spaced holes in the panel along the board perimeters so that board separation is performed by breaking along the lines of perforations.

The punch-back method utilizes a custom-made die to punch each board out of the panel and then pull it back into the panel so that, after population, the boards are easily pushed from the panel.

All of these "break-away" methods of preparing panels, for subsequent separation of the populated PCB's, inherently rob the panel of its rigidity. Consequently, the panels are prone to: sagging during wave soldering; excessive warping; and premature breakage. Moreover, methods incorporating excessive treatment by a router are expensive, can permit solder to overflow onto the component side of the panel during wave soldering, and often can require a secondary procedure for removing tab stubs. Perforation and scoring yeild poor quality edges and cannot hold close tolerances. Punch-back methods require expensive tooling and cannot process zero-spaced configurations, i.e., panels without scrap strips between adjacent circuit boards. Premature separation during panel handling is frequently encountered with the punch-back and scoring methods.

Whether or not the boards have been populated, high precision shearing is recognized as a preferred, cost-effective method for PCB profiling by separating individual boards from the panels. The shock to delicate components and traces, normally encountered during the separating of boards from panels by breaking along perforation or score lines, can be obviated by shearing blade configurations. Further, a panel may be gently sheared without the shock of other methods, while providing excellent edge quality and holding board perimeter tolerances within 0.005 inches, repeatedly. Since there are no tab stubs to be removed with the shearing method, the circuit boards often can be zero-spaced (without waste strips) in order to provide more boards per panel. In fact, many rectangular boards can be sheared in less time than it takes to cut the same run with an NC router, while irregular boards can be cut by combining the routing and shearing methods to minimize the routing and maximize panel rigidity. The clean, simple edges provided by shearing also enhances computer aided design and manufacturing (CAD/CAM).

BRIEF SUMMARY OF THE INVENTION

The instant invention is particularly directed to the method and apparatus for automated handling of panels comprising a plurality of interconnected substrates in order to control and separate the circuit boards in a continuous processing line. One embodiment incorporates two shearing stations and a rotary transfer device therebetween in order to transfer a panel portion from the first station to the second station while controlling and rotating the panel for subsequent feed to the second station such that the panel portion is cut on a line of the substrate which is perpendicular to the original line of cut of the substrate. Throughout the handling of the panels and panel portions, sensing, gripping, and indexed feeding of the panels and panel portions are under the control of a programmable computer.

BRIEF DESCRIPTION OF THE DRAWINGS

FIG. 1 is a top plan view of a first embodiment of the invention.

FIG. 2 is a front elevation of the device of FIG. 1.

FIG. 3 is a top plan view of the input conveyor assembly.

FIG. 4 is a side elevation of the input conveyor assembly.

FIG. 5 is a partial top plan view as viewed generally in the direction of arrows 5—5 of FIG. 4.

FIG. 6 is a top plan view of the input feed assembly.

FIG. 7 is a front elevation of the device of FIG. 6.

FIG. 8 is a partial left side elevation of the device of FIG. 7.

FIG. 9 is a partial, enlarged view, with portions thereof in section, in order to illustrate various operational features of the clamping assembly.

FIG. 14 is a side elevation of the output conveyor assembly.

FIGS. 16A-16D are schematic side elevational views illustrating board sensing, gripping, and feeding by the clamping assembly as well as ejection of scrap material upon completion of shearing.

FIG. 17 is a partial top plan view of a second embodiment of the instant invention.

FIG. 18 is a front elevation of the embodiment of FIG. 17.

FIG. 19 is an enlarged fragmentary view of the pivotal frame supporting the shuttle assembly of the second embodiment.

DETAILED DESCRIPTION OF THE INVENTION

Figure 10:
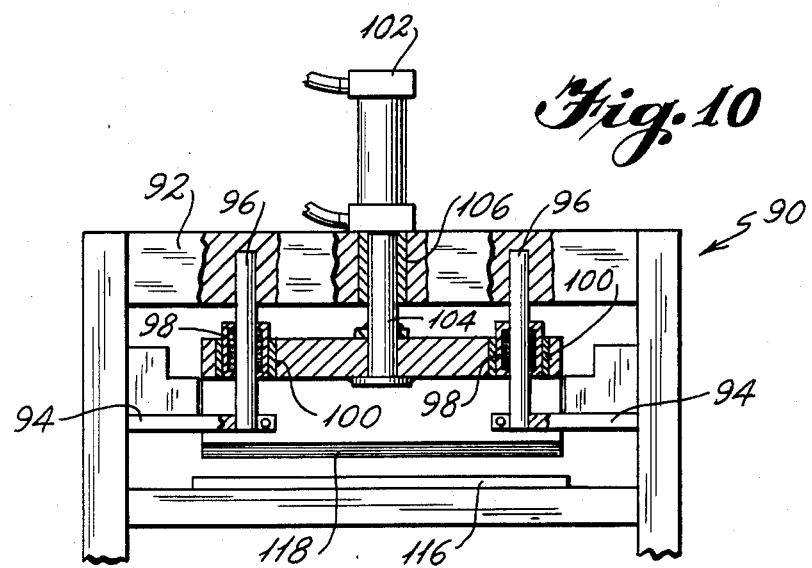
FIG. 10 is a partial elevational view, as viewed from the output of the machine, in order to illustrate the support and operation of the moveable shearing blade.

Referring to FIGS. 1 and 2 for an overall view of one embodiment of the instant invention, it may be seen that the apparatus comprises an input conveyor assembly 10 which feeds circuit board panels to a feed assembly 40 at which they are gripped and controllably fed into position for shearing by shearing assembly 90, whereupon the separated circuit boards are transferred therefrom by means of an unloading conveyor 130.

A better understanding of the invention may be gained by continuing to refer to FIGS. 1 and 2 during the following description of the remaining, more detailed drawings.

Referring to FIGS. 3 and 4, an input conveyor assembly 10 comprises a frame 12 fixably attached to a main frame 8 of the overall machine in order to support board guiding side rails 16 during conveying of the boards by means of chain 21 to a feed assembly 40. Conveyor chain 21 is driven by motor 22 and drive shaft/sprocket arrangement 24 (best seen in FIG. 3). The conveyor chain 21 and guide rails 16 are laterally adjustable to accommodate various widths of circuit board panels 2, and guide rails 16 extend beyond the ends of conveyor chain 21 to a position adjacent the front of shearing assembly 90.

Cooperating with the input or upstream portion of conveyor assembly 10 are optical detectors, with optical detector 32 sensing the front edge of a panel being fed by the conveyor, so as to initiate actuation of locator/delay pin 26 such that a panel is properly positioned for sensing coding notches or the like by optical detectors 34. By provision of the code sensing arrangement, an appropriate program may be selected automatically in order to control operation on a particularly configured circuit board array of panel 2 during feeding and shearing.

Referring to FIG. 4, the phantom line 55 represents the top surface of feed assembly rails 54 (of FIG. 1) and, as illustrated, surface 55 is lower than the top run of conveyor 21 in order to facilitate subsequent clamping and indexed feeding of the circuit board by a clamping assembly. A timing belt and sprocket arrangement 38 (FIG. 5) provides drive to rollers 36 which are in line with each conveyor chain 21. These rollers 36 have a frictional board engaging periphery of rubber or the like, so as to gradually lower the boards or panels 2 from the top run of chains 21 onto slide rails 54 via frictional engagement with the rollers 36.

For ease of conveying the circuit boards by conveyor chains 21, panels 2 are rather loosely guided by rails 16, so that, upon passing to slide rails 54 of feed assembly 40, panels 2 must be aligned properly for the clamping assembly and proper feeding to the shearing assembly. In order to so align the panels, a justifier plate 37 (FIGS. 4 and 5) comprises a portion of one of the guide rails 16 and is displaceable transversely to the direction of feed of the boards so as to square one edge of the panels against the opposite guide rail 16.

Feed assembly 40 is illustrated in FIGS. 6-8 and comprises a frame of angle irons 42 pivotally attached to the main frame 8 by rod 44 on the upstream end of feed assembly 40. Supported by frame 42 are a pair of Thompson shafts 46 along which a shuttle 56 is reciprocatable via actuation of a lead screw 48 which is also supported by frame 42. Lead screw 48 is driven via servomotor 50 and encoder 51 in order to provide drive and tracking of the shuttle 56 during such reciprocation. Shuttle 56 in turn supports transverse rods 58 along which clamp assemblies 60 are adjustable according to the circuit board panel being handled. The downstream end of feed assembly 40 is freely supported upon main frame 8 and elevated therefrom by actuation of cylinder 52, for a "bumping" action yet to be described.

Referring to FIG. 9, clamping assembly 60 is supported on transverse guide rods 58 of shuttle 56 (FIGS. 7 and 9) and comprises a base 62 to which fixed clamp portion 70 is attached by machine screws 75. Fixed clamp portion 70 includes fixed jaw 71 cooperable with tapered pin 68 of pivotal jaw 66 during clamping. Jaw 66 pivots about rod 67 during extension and retraction of piston rod 65 by cylinder 64, and rod 72 acts as a stop for pivotal jaw 66 in the retracted positon of piston rod 65. With the apparatus of the instant invention, no additional holes are necessary in the printed circuit board panel other than holes which are normally provided for handling by the circuit board manufacturer. These tooling holes 7 in the panels 2 are utilized as positional central references by the method and apparatus of the instant invention in order to properly orient and grip the panel 2 for subsequent feeding to shearing assembly 90. An optics system comprising transmitter 76 and receiver 78 is incorporated into clamping assembly 60, as seen in FIG. 9, with transmitter 76 situated in pivotal jaw 66 and receiver 78 located on the tip of a support rod 79 depending from base 62. When the clamping cylinder retracts rod 65, an optics path may be completed through each tooling hole 7 of circuit board panel 2, with fixed jaw 71 appropriately cut away to allow passage of light beam 77. For the situation where tooling holes 7 of the circuit board panel 2 are provided in a scrap portion of the panel and the scrap portion remains in clamp assembly 60 after the remainder of the panel has been removed by separation of the individual circuit boards, an ejector is provided to propel the scrap portion through the separated shearing blades so that a scrap diverter 124 may guide the scrap portion to fall along path 126 into scrap bin 128 (FIG. 2). The ejector comprises a pusher 89 at the end of a rod 87 actuatable by cylinder 86, with a guide rod 88 for pusher 89. In order to ensure that both tooling holes 7 have been accurately gripped in the spaced pair of clamp assembies 60, a verifier optics system 80 cooperates with plate 82 having a slot 84 therein, with plate 82 being clamped to piston rod 65 of clamp cylinder 64 so as to reciprocate therewith. When proper clamping has been achieved by a clamp 60, slot 84 will be positioned so as to allow an optics path to be completed by optic system 80. The optics system 80 must be properly completed on both clamp assemblies 60 in order for the feeding process to proceed. If the panel 2 has not been properly gripped by one or both of the clamp assemblies 60, then both clamps will be opened and, according to controller 9, shuttle 56 will be returned to its original upstream position so that the clamping procedure may be reinstituted.

Figure 16B:
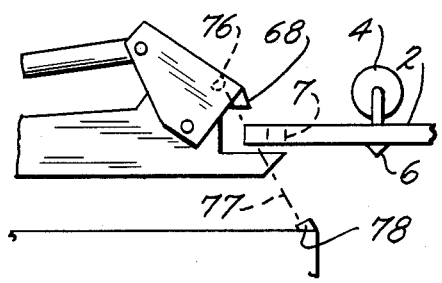
Figure 16C:
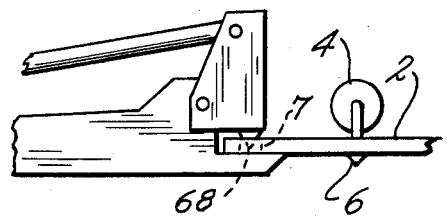
Figure 16D:
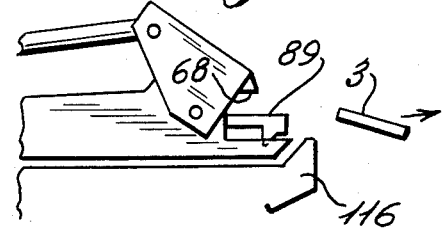
Figure 15A:
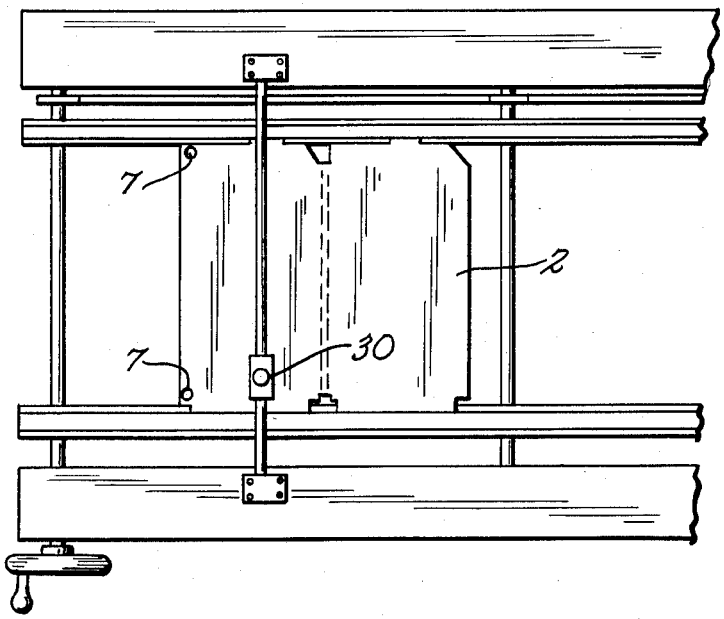
Figure 15B:
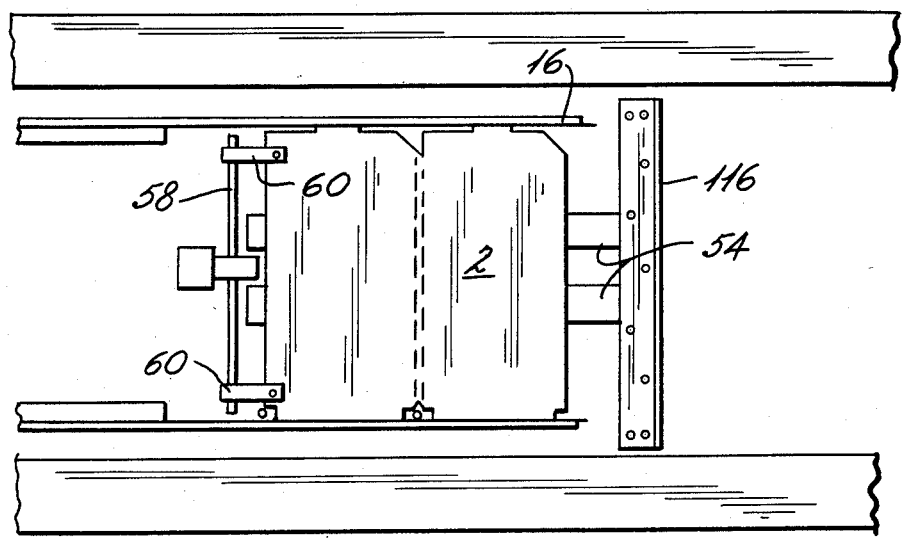
Figure 20:
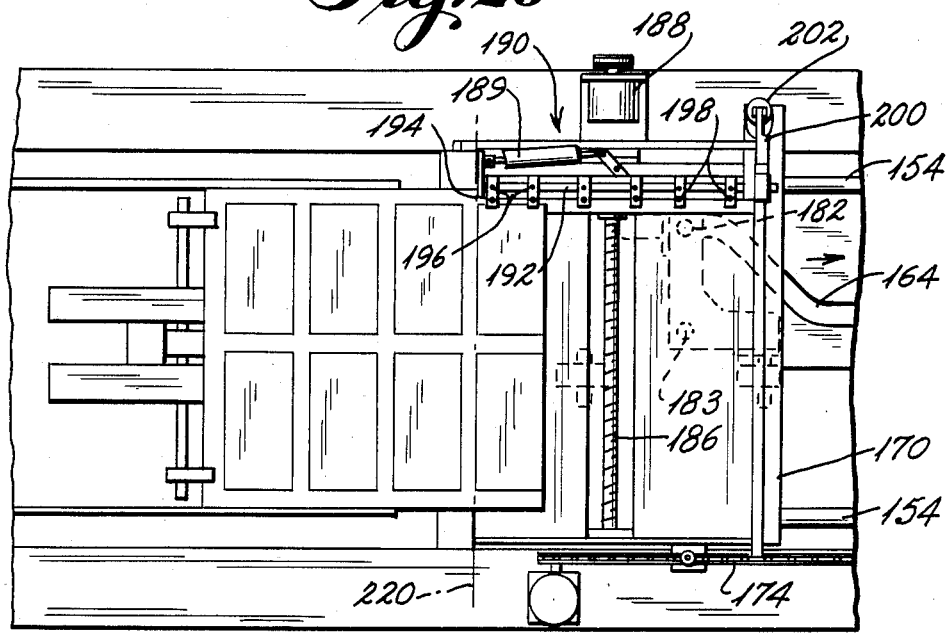
FIGS. 20-23 are partial top plan views illustrating handling of a panel portion by the rotary transfer assembly of the second embodiment, from pickup of the panel portion after a first shearing operation through rotating and feeding the panel portion for a subsequent shearing operation.
Figure 21:
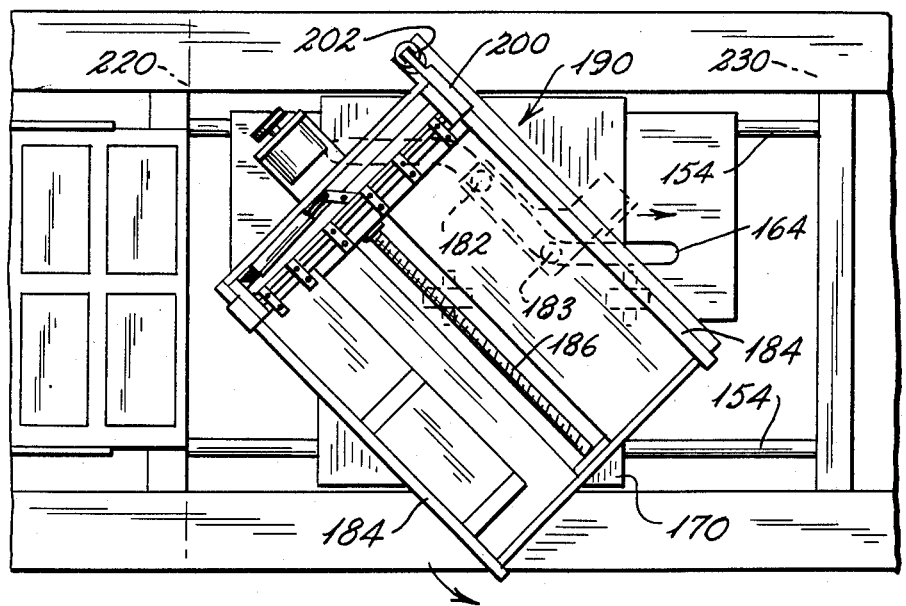

With a panel properly gripped by both clamp assembies, the panel is fed forward via driving of shuttle 56 along lead screw 48 according to the program previously selected during sensing of the board by code detectors 34. When handling panels previously populated with components, there is sometimes a slight warp in the plane of the panel after soldering the component leads by a wave soldering machine or the like. To overcome any feeding problems due to warping of the panel, a board guide flap 18 is provided on the downstream end of each guide rail 16, with the flaps 18 each being pivoted at points 19 and biased to the downward position by spring plungers 20. A further problem which may be encountered when dealing with panels which have already been populated with components 4 is caused by lead tips 6 which extend below the bottom surface of panels 2, as illustrated in FIG. 16A. In order to prevent any interference to feeding of the boards that such depending lead portions may cause with lower fixed shear blade 116 during feeding of the unsheared panel into position between the blades of the shear assembly, the downstream end of feed assembly 40 may be "bumped" up by cylinder 52 (FIG. 7), thus providing clearance between lead portions 6 and fixed shearing blade 116 during positioning of the panel 2 for shearing.

Figure 12:
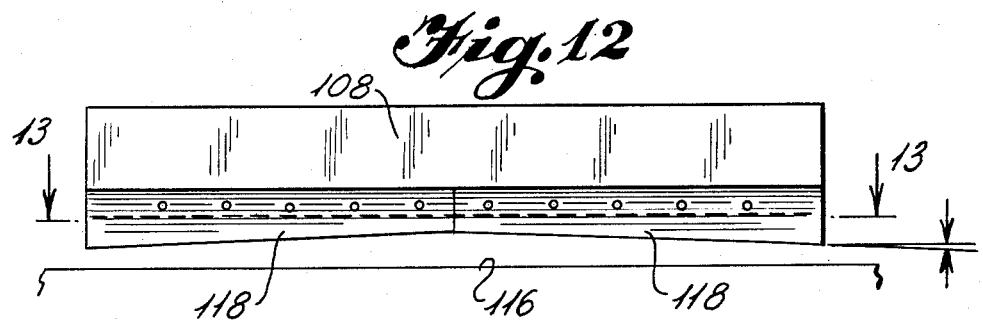
FIGS. 12 and 13 are detail drawings illustrating a particular arrangement of the moveable cutting blade relative to the fixed cutting blade in order to overcome a particular problem of the prior art.
Figure 11:
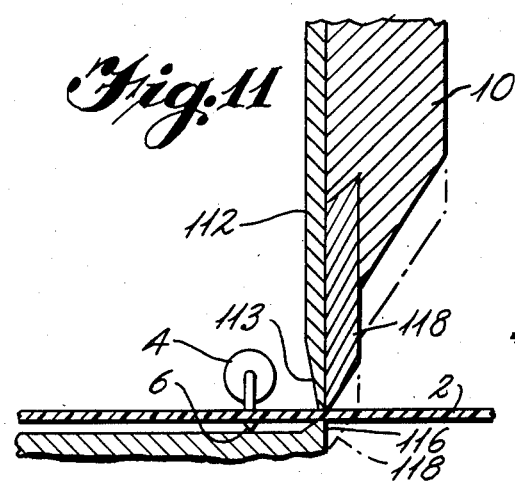
FIG. 11 is a partial cross sectional view which has been enlarged to illustrate the shearing blades and guard assembly relative to a circuit board.

Referring to FIG. 10, shearing assembly 90 comprises an upper support portion 92 and a pair of lower support portions 94 for a pair of pillars 96 along which the moveable blade holder 108 is reciprocatable according to actuation of a drive cylinder 102. Upper support 92 has a bushing 106 therein to provide rigidity to piston rod 104, and blade support 108 has bushings 100 within which bearing sleeves 98 are provided to telescope on pillars 96, also providing rigidity to the moveable blade assembly. Thus, blade holder 108 does not wobble, as sometimes would happen in an earlier prototype, when a circuit board is off-center of the feedpath through the shear assembly. As seen in FIG. 11, the upstream side of the shear assembly has a clamping guard 112 which is spring biased downwardly to engage and clamp panel 2 prior to engagement by blade 118 so that panel 2 is adequately clamped for the shearing action. Referring to FIG. 12, it may be seen that the moveable blade assembly comprises the holder 108 and a pair of blades 118 mounted thereon in an inverted "V" arrangement so that the outer edges of the board are engaged by the cutter before the inner portion thereof to prevent slippage of the board sideways during cutting.

Figure 13:
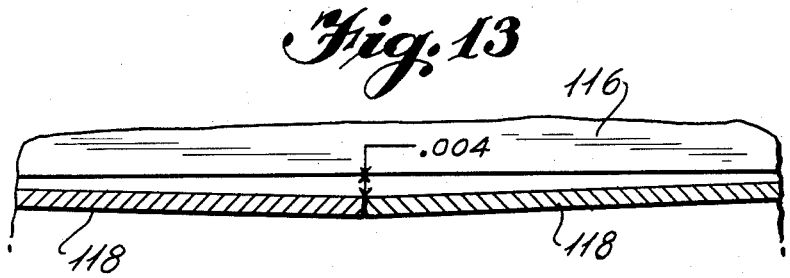
Figure 15C:
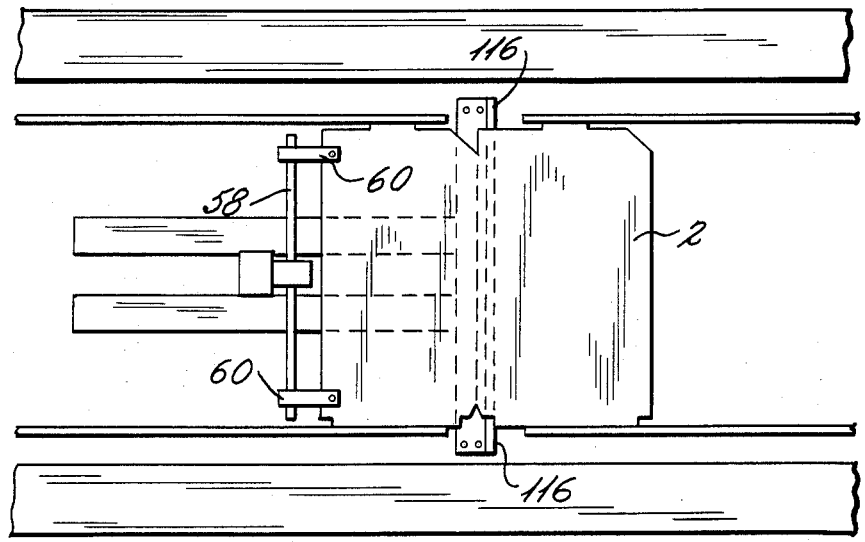
FIGS. 15A–15C are partial top plan views illustrating the passage of a panel from the input conveying system through the feed assembly and into position at the shearing station.

A schematic cross-sectional view through the moveable cutting blade, as viewed from the top (FIG. 13), illustrates that the two blade portions 118 have been tapered so that the middle portion thereof is spaced further than the outer portions from cutting edge 116 of the fixed blade. It has been found, without such a taper and according to the particular thickness and composition of the circuit boards to be sheared, that sometimes the blade 118 would flex and overlap fixed blade 116 during the initial cutting action, causing a fast recovery of the flexed blade 118 upon full closing of the shear assembly and resulting in a poor cut (sometimes breaking) of the board near the mid-portion of the blade assembly. The structural configuration of FIG. 13 eliminates this problem by allowing for such flexure of blade 118 so that a clean shearing action all across the face of fixed blade 116 occurs upon flexure of blade 118.

In a prototype of this embodiment, the distance "d" that would provide for proper shearing action under flexure of blade 118 was found to be 0.004 inches.

Referring to FIG. 14, an unload conveyor assembly 130 receiving separated circuit boards from the shearing assembly 90 comprises a frame 132 which is pivotally attached to the main frame of the machine at 134. Similar to the input conveyor, output conveyor 130 has width-wise adjustable guide rails 136 and conveyor chains 138. A motor/sprocket arrangement 140 provides drive for the conveyor chains 138, and a rear conveyor assembly 130 also has a "bump" function provided, although for a reason different from that of the input feed mechanism 40. The upstream end of output conveyor frame 132 is freely supported upon main frame 8, with a cylinder 142 for lifting the upstream end of frame 132 from main frame 8. This "bumping" function is provided on the output conveyor assembly 130 in order that scrap portions 3 of the panels 2 may pass under the upstream end of output conveyor 130 into a scrap bin 128, while normal unloading of printed circuit boards from the shear assembly 90 does not require actuation of "bumping" cylinder 142.

In a typical operation of the above described embodiment, locater/delay pin 26 is normally in the raised position to stop forward feed of a panel 2 by conveyor chains 21. A front edge detector 32 notifies the controller 9 that a panel 2 is in position for identification, whereupon conveyor chains 21 are halted in order to prevent unnecessary rubbing of the conveyor chains across the conductive portions on the bottom of panel 2. Then, panel 2 is optically sensed by code detectors 34 which sense particular notches in panel 2 or, alternatively, by a bar code reader detecting a particular bar code upon the panels 2. Having identified the board, the pneumatically actuated locater/delay pin 26 is lowered and the appropriate program is activated in accordance with identification of the board. When the feed assembly 40 is appropriately positioned for acceptance of a panel 2 from conveyor assembly 10, conveyor chains 21 are driven to carry the panel 2 forward, over and past the clamp mechanism 60 until panel 2 drops onto the slide racks 54 of feed mechanism 40, from which there is no further advancing to the shear assemby 90 until panel 2 is properly clamped in clamping assembly 60.

In order to ensure proper alignment of the panel for proper gripping by clamping assemblies 60, justifier panel 37 engages one edge of panel 2 and pushes it against a reference surface of the opposite guide panel 16. Thereafter, the shuttle 56 is advanced by actuation of lead screw 48 to carry the open clamped assemblies 60 forward in a function of searching for the positional control reference holes 7, during which the optics path 77 is interrrupted by the edge of panel 2 and recompleted upon proper location of each clamp assembly relative to a tooling hole 7 of panel 2. When a clamp assembly 60 locates a corresponding hole 7, clamp cylinder 64 is fired and moveable clamp jaw 66 is pivoted such that a tapered pin 68 of the actuated clamp 60 enters the tooling hole 7 to effect gripping of the panel.

An advantage of tapering pins 68 is that they are self centering when entering holes 7 so that the of tooling hole 7 placement tolerances of circuit board manufacturers may be easily accommodated.

The verifier optics system 80 on each clamp assembly 60 senses proper or improper engagement of pin 68 with each hole 7 of the panel 2. In the event that only one clamp assembly 60 is properly holding panel 2, both clamp assemblies will be opened and shuttle 56 will be totally retracted to the home position and the procedure will be retried a particular number of times before shutdown of the machine and notification of an operator.

Having properly gripped the panel 2 in clamping assemblies 60, the board is advanced into shearing assembly 90 according to the program corresponding to the particular board configuration. During such feeding, the downstream end of feed assembly 40 is "bumped" up in order that lead portions 6 on the underside of panels 2 will clear fixed shearing blade 16 and a particular line of cut for the circuit panel 2 has been located over fixed cutting blade 16. At this time, feed assembly 40 is lowered such that the panel is supported on the line of cut by fixed blade 116, and thereafter, the shearing function is performed. The height to which the moveable blade 118 is raised to accommodate the thickness of the panel and any components mounted thereon is also controlled by the selected program. For any cut which will produce scrap material on the output side of shear assembly 90, the unload conveyor assembly 130 is "bumped" up by actuation of cylinder 142 such that the scrap produced will pass under the upstream end of unload conveyor assembly 130 and be diverted to a scrap bin 128. For the output of separated printed circuit boards, the output conveyor remains in its normal lowered position and, after the cut is completed, the output conveyor drive is activated to carry the separated circuit board to an unloading point. For a given panel configuration, appropriate sequencing will continue until the last board has been separated from the panel matrix. At this time, the clamps open and any scrap at the trailing edge of the panel is propelled from the clamp assemblies 60 through the open jaws of shear assembly 90 by a pneumatically operated pusher 89.

The upper and lower blades of shear assembly 90 are adjustable in order to maintain accurate tolerances across the width of the cut, with moveable blade 118 having the particular configurations described earlier in reference to FIGS. 12 and 13.

Shearing assembly 90 also incorporates an optics guard system (not shown) comprising an infrared modulated beam positioned 0.187 inches above and 0.025 inches behind the cutting line to prevent or abort a cutting stroke if anything obstructs the blade path, with an override being activated by a gray code bar once the blade enters the light beam path. Operating parameters of the shear, namely shear clearance (upper limit), stroke length, and lower limit, are set and controlled by a remote control unit for the shear or by the main controller. Feedback regarding status of the shear operation vis-a-vis stored parameters is provided by stationary optic sensors interacting with a gray code bar which is attached to the moveable blade and follows its movements.

FIGS. 17-23 illustrate an alternate embodiment of the instant invention which provides for dual-axis profiling in separating of circuit boards from the panel in a two-stage shearing process. This alternate embodiment incorporates the features of the earlier described embodiment with the additions of a rotary transfer assembly for receiving boards from the first stage shear assembly and a second stage shear assembly to which the boards are presented by the rotary transfer assembly. The output conveyor assembly of the earlier embodiment may then follow the second stage shear assembly or, alternatively, other types of off-loading systems such as a robot arm may receive the separated boards on outputting thereof from the second shear station.

In several of the figures, details of the shearing assembly have been omitted in order to provide a better view of the transfer assembly, while indicating the lines of cut 220, 230 respectively, for the first and second stage shears. The shearing assemblies are substantially the same as the earlier described shearing assembly 90, with the first stage shearing assembly being reversed to allow closer approach thereto by transfer assembly 150.

Rotary transfer assembly 150 comprises a frame 152 (best seen in FIG. 19) which is pivotally supported at 156 to the main frame of the overall machine. A spring 162 is provided under the free end of rocking frame 152 which is closest to the first stage shear assembly, and a "bump" actuating cylinder 158 is provided beneath the end of rocking frame 152 at the second stage shear assembly. Additionally, spring plungers (not shown) may be located at the end of rocking frame 152 closest to the second stage shear assembly to oppose the bias of spring 162 and provide a counterbalancing force for a purpose yet to be described.

Frame 152 supports Thompson shafts 154 along which a shuttle 170 is reciprocatable via a drive motor 172 and chain assembly 174. Shuttle 170 rotatably supports a table 180, with rotation being imparted to the table via a cam plate 164 and cam follower 182 during reciprocation of the shuttle 170 back and forth between the first and second stage shear assemblies. Cam follower 182 and table 180 are attached via a shaft 183 and offset arms thereon, with the shaft 183 being rotatably supported by a bearing of shuttle 170, such that camming plate 164 is located below shuttle 170 and receives cam follower 182 therein to guide rotation of table 80 during reciprocation of shuttle 170. Also attached to shaft 183, by offset arms or the like, are suitable stop plates engageable with adjustable stops on the underside of shuttle 170 to provide adjustable limits of rotation for rotary table 180. Adjustable stops for reciprocation of the shuttle 170 may also be provided as needed.

Rotary table 180 has Thompson shafts 184 along which a board gripping assembly 190 is reciprocatable according to a lead screw 186, and servomotor 188, with an encoder 189 enabling positional control of the gripping assembly 190 along Thompson shafts 184.

Gripper assembly 190 comprises a fixed lower plate 192 cooperable with grippers 196 located on pivotal support rod 194. Grippers 196 are adjustably positionable along rod 196, as by keying or the like, and are hard tapered pins which bite into the surface of the circuit board during such gripping. An actuating cyclinder 202 is connected to support rod 194 via angle arm 200 to supply a total gripping force of approximately 180 pounds distributed between selected pins 198 which are gripping a board at the time. In order to properly grip a board, there must be a component-free zone of the substrate material for clearance of the pins during gripping. Such a component-free zone may comprise a portion of the circuit board itself or a scrap portion of the substrate material. For the case in which the pins are engaging a scrap portion of substrate, an ejector plate 204 is provided to reciprocate between the pins 198 and fixed lower plate 192 with a force sufficient to eject scrap material therefrom and through the second stage shear assembly.

In operation of this second embodiment, a panel of material is advanced into the first stage shear assembly 90 in accordance with the earlier described embodiment. With the panel in position for the first cut, the shuttle 170 is moved to the first stage shear assembly and the portion of the panel extending through the shear assembly is gripped by board gripper assembly 190 prior to shearing. By the provision of pivotal support 156 and spring 162, the panel section in the grasp of gripping assembly 190 may be displaced downwardly by the first stage shearing action without flexing inordinately and damaging the traces or solder joints of the circuit board. Once this first cut has been performed, the shuttle 170 will be driven to the second stage shear assembly 210 and, during such drive, rotary table 180 will be rotated 90° in accordance with the cam follower 182 and camming plate 164. Thereafter, the portion of the panel which is gripped by gripping assembly 190 is advanced into the second stage shear assembly 210 via lead screw 186 and motor 188, in accordance with control by the preselected program.

The downstream end of frame 152 is raised by "bumping" cylinder 158, when dealing with circuit boards that have already been populated, in order to clear the lead tips over the fixed blade of the shear assembly during positioning for the second cut. Frame 152 is lowered when the panel is accurately positioned in the second stage shear for cutting.

In operation, if the first cut will produce scrap material at stage one, the transfer shuttle 170 is moved away from the first stage shear assembly sufficiently for scrap material to drop and be diverted to a scrap box 128. Then, shuttle 170 is moved back to the first stage shear assembly and gripping assembly 190 is actuated to grip the portion of a panel 2 which is extending through shear assembly 90. Thereafter, the first cut is made with rocking frame 152 displacing against the bias of 162 during the cut to allow the panel section to drop slightly during shearing without undue flexure and mechanical shock. Rotary transfer assembly 50 then transfers the severed panel portion to the second stage shearing assembly, with rotation of this portion of the panel being provided during such transfer. During the transfer, the downstream end of frame 152 is raised by cylinder 150 in order to provide clearance for the lead tips on the underside of the circuit board when advanced into the second stage shearing assembly. Upon shuttle 170 arriving at second stage shear assembly 210, clamping assembly 190 is advanced across table 180 via lead screw 186 and motor 188 to position the board for the second axis cut, and the downstream end of frame 152 is lowered upon achieving proper positioning of the board and prior to the cut. After the cut, an unload conveyor (as described in the earlier embodiment), a robot arm, or the like may be used to unload the finished circuit board from the second stage shear 210. When necessary, the gripping assembly 190 ejects any scrap through the open second stage shearing blades and is returned to the first stage shearing assembly via retraction along lead screw 188 and movement of shuttle 170 back to the first stage shearing assembly. Thereafter, the cycle is repeated until the last circuit board has been separated from the panel matrix.

Figure 22:
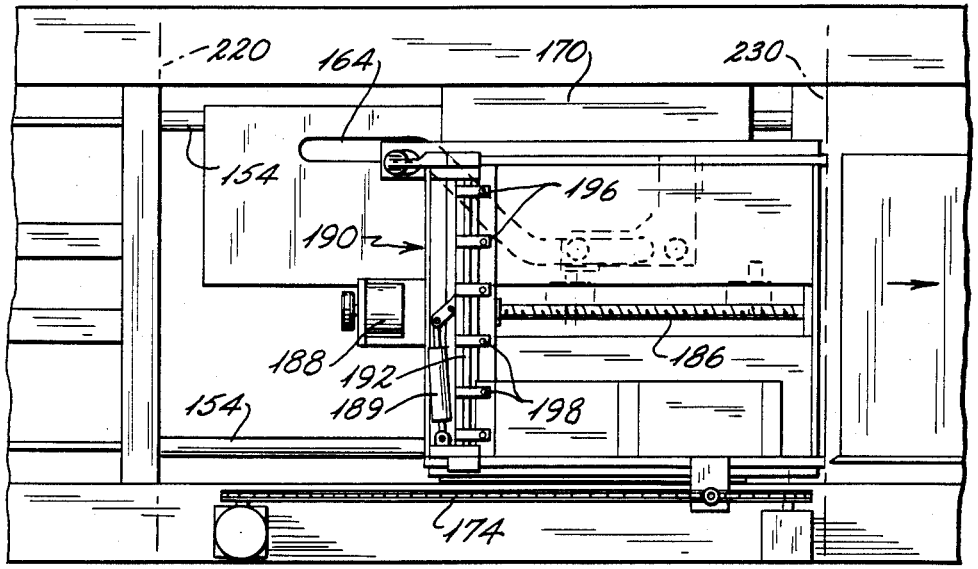
Figure 23:
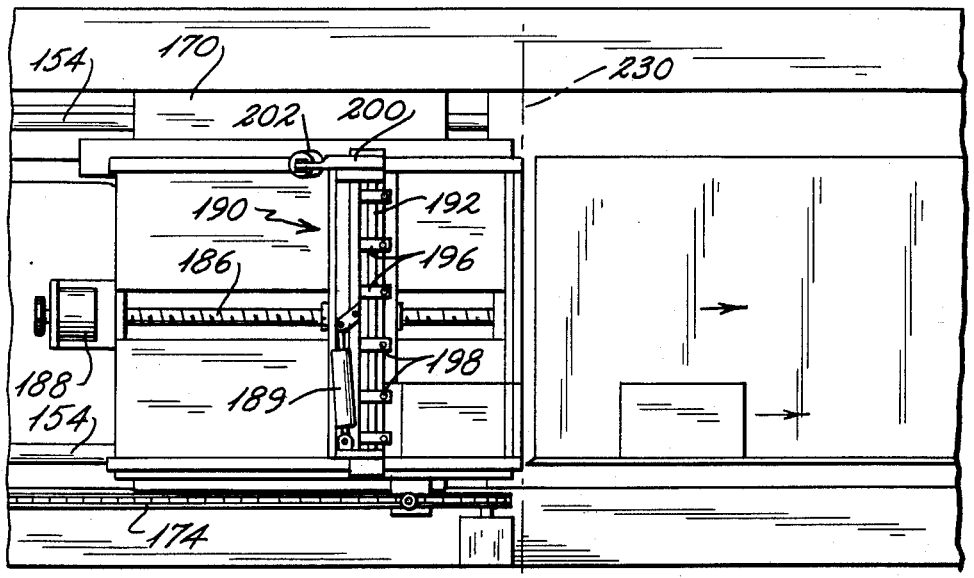

As is discernable from FIGS. 22 and 23, a panel portion which has been positioned for cutting at the second stage will often be offset to one side of the second stage shear assembly. Accordingly, a particular arrangement of the shearing blades 118 and their angling relative to the lower fixed blade in the second shearing assembly may be modified in order that the particular boards being handled in the second stage shear assembly will still be engaged on opposite sides thereof by an angled blade to keep the boards from moving transverse to the line of feed through the shear assembly.

Although particularly directed to separating populated PCB's from multi-board panels, it is contemplated that the invention is also useful in separating unpopulated boards. It is also contemplated that either of the clamping or gripping assemblies may be used for both board holding functions or may be interchangeable with each other. It is further contemplated that the above-noted processing may be printing, such as bar coding, or silk screening before or after population and in conjunction with, before, after, or separate from subdividing of the panel.

It will thus be seen that the objects of the invention, among those made apparent from the preceding description, are efficiently attained and, since certain changes may be made in carrying out the above constructions without departing from the spirit and scope of the invention, it is intended that all matter contained in the above description or shown in the accompanying drawing shall be interpreted as illustrative and not in a limiting sense.

It is also to be understood that the following claims are intended to cover all of the generic and specific features of the invention herein described, and all statements of the scope of the invention, which, as a matter of language, might be said to fall therebetween.

What is claimed is:

1. A method of handling a panel automatedly, said panel having means for referencing positional control of said panel, and comprising the steps of:
   receiving said panel at a feed assembly input;
   searching for said panel referencing means;
   clamping said panel according to and upon locating said referencing means;
   feeding said panel, while clamped, to a processing station and indexing said feeding according to a controller; and
   subdividing said panel at said processing station according to said controller.

2. A method as in claim 1, and further comprising the steps of:
   positioning said panel against a reference surface for subsequent locating of said panel referencing means during said searching; and
   verifying proper clamping of said panel prior to said feeding.

3. A method as in claim 1, and further comprising the step of:
   aligning said panel by said clamping.

4. A method as in claim 1, and further comprising the steps of:
   identifying said panel according to a particular configuration; and
   selecting a particular control routine for said controller according to said identifying.

5. A method as in claim 1, wherein said subdividing comprises the step of:
   separating at least one circuit board from said panel.

6. A method as in claim 5, and further comprising the step of:

cutting said panel to effect said separating.

7. A method as in claim 6, and further comprising the step of:

shearing said panel to effect said cutting.

8. A method as in claim 6, wherein said circuit board has component leads protruding from a lower surface thereof, and further comprising the step of:

displacing said circuit board relative to a cutting member at said processing station in order to provide clearance between said leads and said cutting member during said feeding.

9. A method as in claim 5, wherein said panel further comprises at least one scrap portion, said method further comprising the steps of:

receiving said circuit board from said processing station; and diverting said scrap portions to a scrap pile.

10. A method as in claim 9, wherein said clamping is performed by a clamping means on a final scrap portion of said panel, and further comprising the steps of:

unclamping said final scrap portion; and propelling said final scrap portions from said clamping means.

11. An apparatus for handling a panel automatedly, said panel having means for referencing positional control of said panel, and comprising:

means for receiving said panel at a feed assembly input;

means for searching for said panel referencing means;

means for clamping said panel according to and upon locating said referencing means;

means for feeding said panel, while clamped, to a processing station and indexing said feeding according to a controller; and means for subdividing said panel at said processing station according to said controller.

12. An apparatus as in claim 11, and further comprising:

means for positioning said panel against a reference surface for subsequent locating of said panel referencing means during said searching; and means for verifying proper clamping of said panel prior to said feeding.

13. An apparatus as in claim 11, and said clamping means further comprising:

means for aligning said panel during said clamping.

14. An apparatus as in claim 11, and further comprising:

means for identifying said panel according to a particular configuration; and means for selecting a particular control routine for said controller according to said identifying.

15. An apparatus as in claim 11, and further comprising:

means for separating at least one circuit board from said panel to effect said subdividing.

16. An apparatus as in claim 15, and further comprising:

means for cutting said panel to effect said separting.

17. An apparatus as in claim 16, and further comprising:

means for shearing said panel to effect said cutting.

18. An apparatus as in claim 16, wherein said circuit board has component leads protruding from a lower surface thereof, and further comprising:

means for displacing said circuit board relative to a cutting member at said processing station in order to provide clearance between said leads and said cutting member during said feeding.

19. An apparatus as claim 15, wherein said panel further comprises at least one scrap portion, and further comprising:

means for receiving said circuit board from said processing station; and means for diverting said scrap portions to a scrap pile.

20. An apparatus as in claim 19, wherein said clamping is performed by a clamping means on a final scrap portion of said panel, and further comprising;

means for unclamping said final scrap portion; and means for propelling said final scrap portion from said clamping means.

* * * * *